(12) United States Patent
Kim et al.

(10) Patent No.: US 11,723,250 B2
(45) Date of Patent: Aug. 8, 2023

(54) ELECTROLUMINESCENT DISPLAY DEVICE

(71) Applicant: LG Display Co., Ltd., Seoul (KR)

(72) Inventors: MinKyu Kim, Paju-si (KR); ByungJun Lim, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/703,544

(22) Filed: Mar. 24, 2022

(65) Prior Publication Data

US 2022/0216294 A1 Jul. 7, 2022

Related U.S. Application Data

(63) Continuation of application No. 16/889,482, filed on Jun. 1, 2020, now Pat. No. 11,316,004.

(30) Foreign Application Priority Data

Jun. 25, 2019 (KR) ........................ 10-2019-0075367

(51) Int. Cl.
| | | |
|---|---|---|
| H01L 27/32 | (2006.01) | |
| H01L 51/52 | (2006.01) | |
| H10K 59/131 | (2023.01) | |
| H10K 59/122 | (2023.01) | |
| H10K 59/126 | (2023.01) | |
| H10K 59/121 | (2023.01) | |
| H10K 50/805 | (2023.01) | |
| H10K 50/813 | (2023.01) | |
| H01L 27/12 | (2006.01) | |
| H10K 50/818 | (2023.01) | |
| H10K 59/124 | (2023.01) | |
| H10K 59/35 | (2023.01) | |

(52) U.S. Cl.
CPC ....... *H10K 59/1315* (2023.02); *H10K 59/122* (2023.02); *H10K 59/126* (2023.02); *H01L 27/124* (2013.01); *H10K 50/805* (2023.02); *H10K 50/813* (2023.02); *H10K 50/818* (2023.02); *H10K 59/124* (2023.02); *H10K 59/1213* (2023.02); *H10K 59/352* (2023.02)

(58) Field of Classification Search
CPC ............. H01L 27/3279; H01L 27/3246; H01L 27/3272; H01L 27/124; H01L 27/3262; H01L 27/3258
See application file for complete search history.

(56) References Cited

U.S. PATENT DOCUMENTS

| | | |
|---|---|---|
| 6,861,279 B2 | 3/2005 | Nakanishi et al. |
| 7,488,849 B2 | 2/2009 | Kawakami |
| 7,737,626 B2 | 6/2010 | Kumaki et al. |

(Continued)

*Primary Examiner* — Mohsen Ahmadi
(74) *Attorney, Agent, or Firm* — Fenwick & West LLP (57) ABSTRACT

An electroluminescent display device includes a substrate having an emission region and a bezel region, a bank layer that extends from the emission region to the bezel region, a plurality of signal lines which are disposed on different layers on the substrate, a first metal layer that overlaps the plurality of signal lines and has a step, a second metal layer that is disposed on the first metal layer, and an intermediate layer between the first and second metal layer. A step or curvature above the first electrode may be offset by the first intermediate layer so that incident from the outside is inwardly reflected. Therefore, a failure that a user at the outside recognizes the reflected light may be solved.

21 Claims, 4 Drawing Sheets

(56) References Cited

U.S. PATENT DOCUMENTS

| | | |
|---|---|---|
| 10,095,074 B2 | 10/2018 | Koide |
| 2004/0080266 A1 | 4/2004 | Park et al. |
| 2004/0211964 A1 | 10/2004 | Sakakura et al. |
| 2008/0308850 A1 | 12/2008 | Berthold et al. |
| 2013/0009154 A1* | 1/2013 | Choi .................. H01L 27/1288 |
| | | 257/E21.409 |
| 2014/0138651 A1 | 5/2014 | Oh |
| 2014/0312339 A1 | 10/2014 | Fujita |
| 2018/0124933 A1* | 5/2018 | Park ...................... H01L 27/32 |
| 2018/0267353 A1 | 9/2018 | Takeda et al. |
| 2019/0041915 A1* | 2/2019 | Park .................. H01L 27/3276 |
| 2019/0148672 A1* | 5/2019 | Seo .................... H01L 51/5271 |
| | | 257/40 |
| 2019/0165312 A1* | 5/2019 | Bae .................... H01L 51/5246 |
| 2019/0179466 A1* | 6/2019 | Kim ................... H01L 51/5256 |
| 2019/0189975 A1 | 6/2019 | Lim et al. |
| 2019/0198599 A1* | 6/2019 | Son ...................... H10K 50/84 |
| 2019/0198600 A1* | 6/2019 | Son ...................... H10K 50/11 |
| 2019/0206949 A1* | 7/2019 | Park .................. H01L 27/3276 |
| 2020/0075692 A1* | 3/2020 | Park .................. H01L 27/3244 |
| 2020/0176529 A1* | 6/2020 | Choi .................. H01L 27/3234 |
| 2020/0194522 A1* | 6/2020 | Lee ...................... H10K 71/12 |
| 2020/0194714 A1* | 6/2020 | Won .................. H01L 27/3248 |
| 2020/0212139 A1* | 7/2020 | Baek ................. H01L 51/5256 |
| 2020/0321406 A1* | 10/2020 | Lee .................... H01L 27/323 |

\* cited by examiner

FIG. 4

ELECTROLUMINESCENT DISPLAY DEVICE

CROSS-REFERENCE TO RELATED APPLICATIONS

This application is a continuation of U.S. patent application Ser. No. 16/889,482 filed on Jun. 1, 2020, which claims the priority of Republic of Korea Patent Application No. 10-2019-0075367 filed on Jun. 25, 2019, in the Korean Intellectual Property Office, each of which is hereby incorporated by reference in its entirety.

BACKGROUND

Field

The present disclosure relates to an electroluminescent display device, and more particularly, to an electroluminescent display device which suppresses light reflection of a non-display area which is visibly sensed at a specific viewing angle to improve reliability.

Description of the Related Art

An image display device which implements various information on a screen is a core technology in an information communication era and is developing to be thinner, lighter, and portable, and have higher performance. Therefore, an electroluminescent display device which is manufactured to be light and thin to reduce weight and volume which are disadvantages of a cathode ray tube (CRT) is getting the spotlight. The electroluminescent display device is a self-emitting device and is driven at a low voltage to be advantageous not only in terms of power consumption, but also in terms of a high response speed, a high emission efficiency, a viewing angle, and a contrast ratio. Therefore, the electroluminescent display device is being studied as the next generation display. The electroluminescent display device implements images through a plurality of sub pixels disposed in a matrix. Each of the plurality of sub pixels includes a light emitting diode and a pixel circuit which is formed of a plurality of transistors which independently drives the light emitting diode.

Various operation signals which operate the pixel circuit are applied through a wiring line of the display device. In this case, in order to suppress undesired parasitic capacitance or signal interference, a predetermined interval between the wiring lines is required. As the display device is developed to implement a high resolution with a large size, it is difficult to accommodate all the increased number of wiring lines on one layer. Therefore, a design which disposes wiring lines on a plurality of layers is introduced to dispose more data lines with the same size. However, a problem is caused due to a step (a height difference) generated above the wiring lines caused by the wiring lines which are distributed on the plurality of layers. Specifically, a black matrix or a bezel is formed in a non-display area of the display device so that the non-display area is not visibly sensed. However, there may be a problem in that light is reflected due to the step of the wiring lines so that the reflected light is visibly sensed at a specific viewing angle.

SUMMARY

An object of the present disclosure is to provide an electroluminescent display device which suppresses light reflection in a non-display area which may be visibly sensed at a specific viewing angle to improve a reliability.

According to an aspect of the present disclosure, an electroluminescent display device includes: a substrate including an emission region that emits light and a bezel region that does not emit light; a bank layer that extends from the emission region to the bezel region; a plurality of signal lines that are disposed on different layers on the substrate in the bezel region; a first metal layer that overlaps the plurality of signal lines in the bezel region, the first metal layer including a step; a second metal layer disposed on the first metal layer in the bezel region, the second metal layer closer to the bank layer than the first metal layer; and a first intermediate layer between the first metal layer and the second metal layer in the bezel region.

Further, according to another aspect of the present disclosure, an electroluminescent display device includes: a substrate including a display area that displays an image and a non-display area that does not display the image; a plurality of signal lines disposed on the substrate in the non-display area; a first metal layer that includes a bend, the first metal layer overlapping the plurality of signal lines in the non-display area; and a second metal layer on the first metal layer in the non-display area, wherein distances between different portions of the first metal layer and the second metal layer and the plurality of signal lines are different.

Further, according to another aspect of the present disclosure, an electroluminescent display device includes: a substrate including an emission region that emits light and a bezel region that does not emit light; a bank layer that extends from the emission region to the bezel region; a plurality of signal lines that are disposed on different layers on the substrate in the bezel region; a first metal layer that overlaps the plurality of signal lines in the bezel region; a first intermediate layer on the first metal layer in the bezel region; a second metal layer disposed on the first intermediate layer in the bezel region, the second metal layer including a plurality of openings; and a second intermediate layer on the second metal layer in the bezel region, the second intermediate layer directly connected to the first intermediate layer though the plurality of openings in the bezel region.

Objects of the present disclosure are not limited to the above-mentioned objects, and other objects, which are not mentioned above, can be clearly understood by those skilled in the art from the following descriptions.

According to the present disclosure, a step or a curvature above a metal layer is offset by organic material layers which are doubly configured in a non-display area so that light which is incident from the outside is suppressed from being reflected by the metal layer in the electroluminescent display device, thereby solving the failure that a user recognizes the reflected light at a specific viewing angle.

According to the present disclosure, heights of top surfaces of the metal layers are uniformly formed in the electroluminescent display device so that the curvature is reduced, thereby improving the durability during the modification such as bending or folding.

Further, according to the present disclosure, an upper metal layer among metal layers which are electrically connected has a lattice structure so that it is advantageous to outgas a gas component and adhesiveness of organic material layers formed above and below the metal layer is improved to reduce a loosening failure.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or there between.

If it is described that a component is "connected" or "coupled" to another component, it is understood that the component is directly connected or coupled to the other component but another component may be "connected" or "coupled" between the components.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The term "at least one" is understood to include all combinations which can be proposed from one or more related items. For example, at least one of a first item, a second item, and a third item means not only each of the first item, the second item, and the third item, but also a combination of all items to be proposed from two or more of the first item, the second item, and the third item.

The features of various embodiments of the present disclosure can be partially or entirely adhered to or combined with each other and can be interlocked and operated in technically various ways, and the embodiments can be carried out independently of or in association with each other.

Hereinafter, an electroluminescent display device according to exemplary embodiments of the present disclosure will be described in detail with reference to accompanying drawings.

When reference numerals refer to components of each drawing, although the same components are illustrated in different drawings, the same components are referred to by the same reference numerals as possible. Further, scales of components illustrated in the accompanying drawings are different from the real scales for the convenience of description, so that the scales are not limited to those illustrated in the drawings.

Figure 1A:
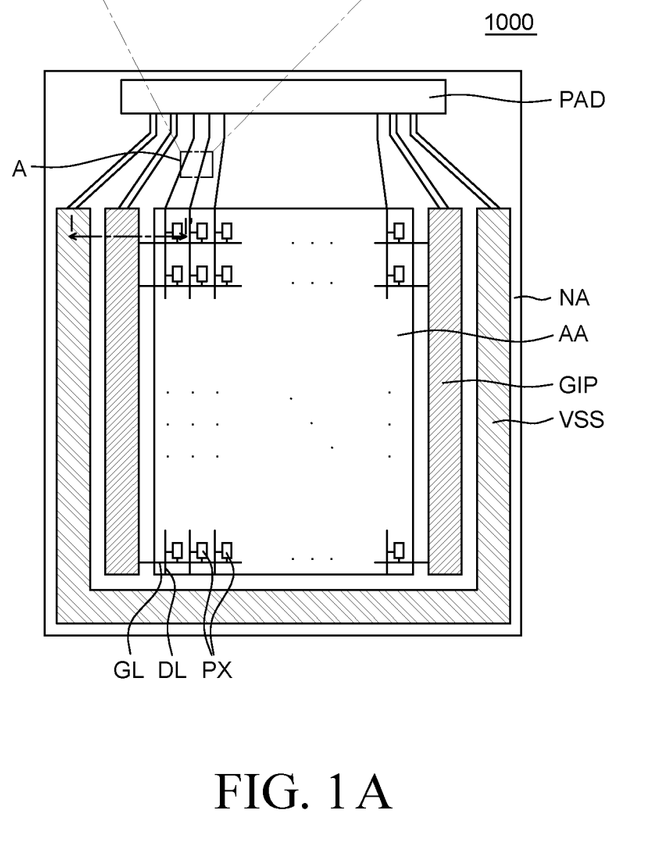
FIG. 1A is a plan view of an electroluminescent display device according to an embodiment of the present disclosure.

FIG. 1A is a plan view of an electroluminescent display device 1000 according to an embodiment of the present disclosure. Referring to FIG. 1A, the electroluminescent display device 1000 may include a substrate 110 (shown in FIG. 2), a gate driver GIP, a power supply line VSS, and a pad PAD.

The substrate 110 supports various components of the electroluminescent display device 1000. The substrate 110 may be formed of a plastic material having flexibility. For example, the substrate 110 may be formed of polyimide (PI), but is not limited thereto.

In the substrate 110, a display area AA and a non-display area NA enclosing the display area AA may be defined. The display area AA is an area in which an image is actually displayed in the electroluminescent display device 1000 and a light emitting diode and various driving elements for driving the light emitting diode are disposed in the display area AA. The non-display area NA is an area where images are not displayed and the non-display area NA may be an area enclosing the display area AA. Various components for driving a plurality of pixels PX disposed in the display area AA may be disposed in the non-display area NA. For example, as illustrated in FIG. 1, various signal lines such as a gate line GL or a data line DL, the gate driver GIP, the power supply line VSS may be disposed in the non-display area NA of the substrate 110.

In the display area AA, a plurality of sub pixels which configures the plurality of pixels PX is disposed in a matrix to display images. Each sub pixel includes a thin film transistor serving as a pixel driving circuit and a light emitting diode which is connected to the thin film transistor.

In at least one direction of non-display area NA which is adjacent to the display area AA, a pad PAD which is applied with power and a signal from a timing controller and a power supply unit at the outside of the display panel to the display panel may be disposed.

The gate driver GIP outputs a gate signal and an emission control signal under the control of the timing controller to select a pixel PX in which a data voltage is charged through a wiring line such as a gate line GL or an emission control signal line and adjust an emission timing. The gate driver GIP shifts a scan signal and an emission control signal using a shift register to sequentially supply the gate signal and the emission control signal. The gate driver GIP may be directly formed on the substrate 110 by a gate-driver in panel (GIP) manner, but is not limited thereto.

The power supply line VSS is a wiring line which is electrically connected to a first driving electrode of a light emitting diode to be described below to supply power. As the power supplied at this time, a common voltage may be applied. The power supply line VSS, as illustrated in FIG. 1A, is formed at the outside of the display area AA and the gate driver GIP to enclose the display area AA and the gate driver GIP. The power supply line VSS may be formed of the same material as a source electrode and a drain electrode of the thin film transistor, but is not limited thereto, and may be formed of the same material as a gate electrode of the thin film transistor.

The non-display area NA in a direction in which the pad PAD is located is bendable. As the non-display area NA is bent in a direction in which the pad PAD is located, an external module which is bonded to be connected to the pad PAD, for example, a printed circuit board moves toward a rear surface of the substrate 110 and the external module may not be visibly recognized as seen from an upper portion of the substrate 110. Further, as the non-display area NA is bent in a direction in which the pad PAD is located, the size of the non-display area NA which is visibly recognized from the upper portion of the substrate 110 is reduced so that a narrow bezel may be implemented.

Figure 1B:
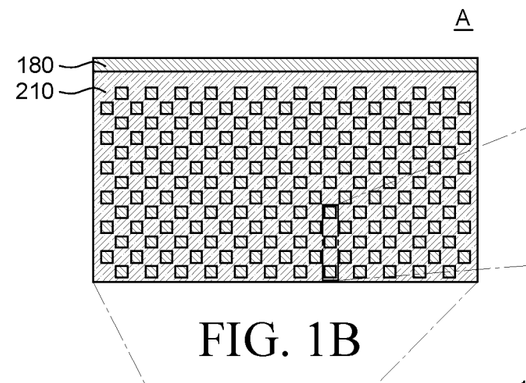
FIG. 1B is a plan view of region A of the electroluminescent display device shown in FIG. 1A according to an embodiment of the present disclosure.
Figure 1C:
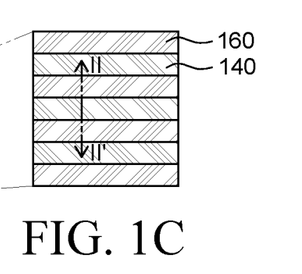
FIG. 1C is a detailed view of region A according to an embodiment of the present disclosure.

Detailed description will be provided with reference to FIGS. 1B and 1C which enlarge the region A which is a part of the non-display area NA in a direction where the pad PAD is located. For more understanding of the present disclosure, in FIGS. 1B and 1C which enlarge the region A, only some components are illustrated rather than all components and details thereof will be described below.

Figure 2:
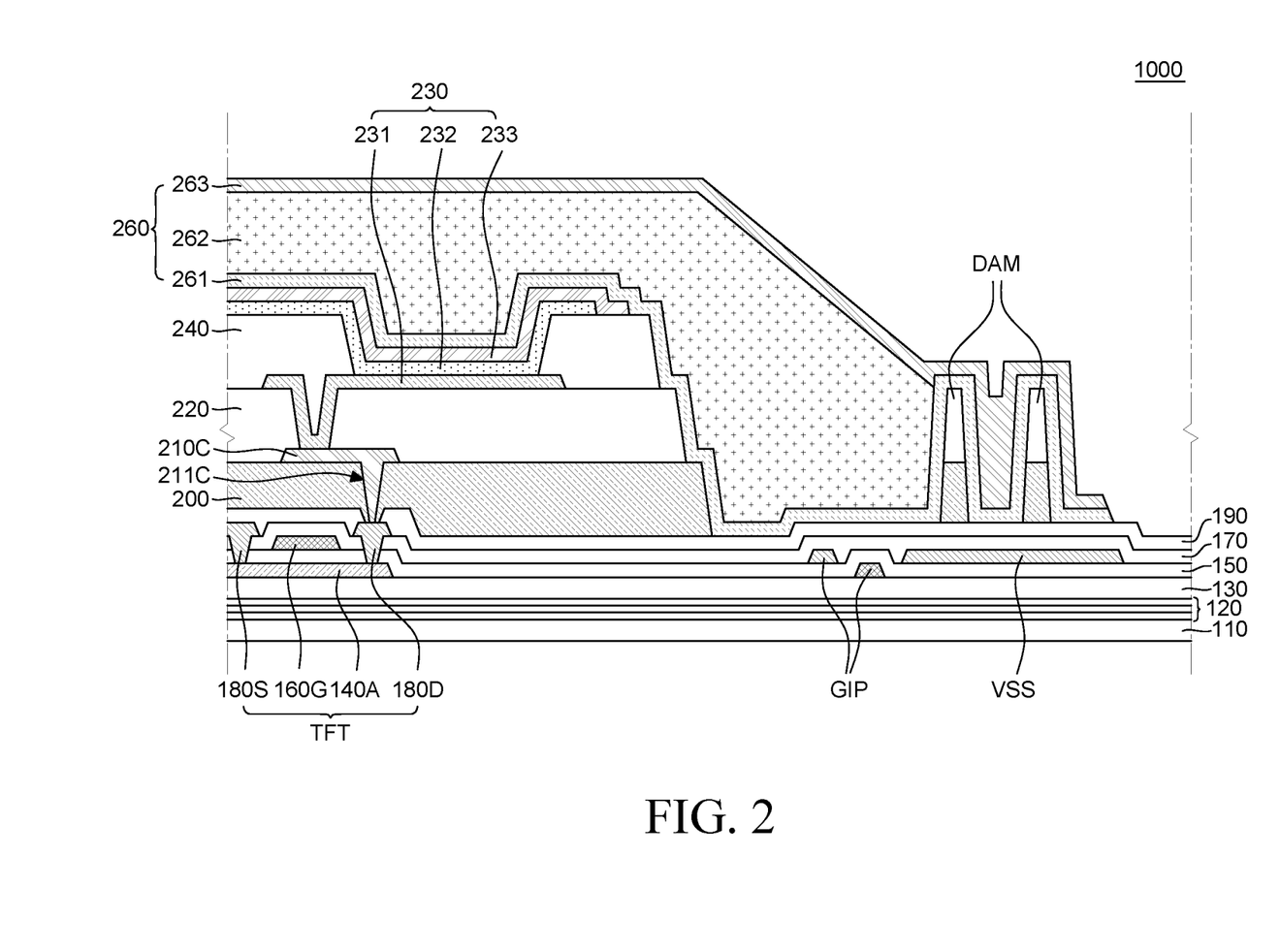
FIG. 2 is a cross-sectional view of an electroluminescent display device taken along the line I-I' of FIG. 1A.

FIG. 2 is a cross-sectional view illustrating the electroluminescent display device 1000 taken along the line I-I' of FIG. 1A.

Referring to FIG. 2, a thin film transistor TFT which drives the light emitting diode 230 may be disposed in the display area AA on the substrate 110. The thin film transistor TFT may include a semiconductor layer 140A, a gate electrode 160G, a source electrode 180S, and a drain electrode 180D. The thin film transistor TFT is a driving thin film transistor. Even though only a driving thin film transistor is illustrated among various thin film transistors which may be included in the electroluminescent display device 1000 for the convenience of description, another thin film transistor such as a switching thin film transistor may also be included in the electroluminescent display device 1000. Further, in the present disclosure, even though it is described that the thin film transistor TFT has a coplanar structure, the thin film transistor may be implemented to have another structure such as a staggered structure and is not limited thereto.

The thin film transistor TFT controls current which is supplied from a high potential VDD supply line to the light emitting diode 230 in response to a data signal supplied to the gate electrode 160G of the thin film transistor TFT. Therefore, the thin film transistor may adjust an emission amount of the light emitting diode 230 and supplies a constant current by a voltage charged in a storage capacitor (not illustrated) until a data signal of a next frame is supplied to allow the light emitting diode 230 to maintain emission. The high potential supply line may be formed to be parallel to the data line DL.

As illustrated in FIG. 2, the thin film transistor TFT may include the semiconductor layer 140A disposed on the first insulating layer 130, the gate electrode 160G overlapping the semiconductor layer 140A with a second insulating layer 150 therebetween, and the source electrode 180S and the drain electrode 180D which are formed on a third insulating layer 170 to be in contact with the semiconductor layer 140A.

When the thin film transistor TFT is driven, a channel is formed in the semiconductor layer 140A. The semiconductor layer 140A may be formed of an oxide semiconductor or various organic semiconductors such as amorphous silicon (a-Si), polycrystalline silicon (poly-Si), or pentacene, but is not limited thereto. The semiconductor layer 140A may be formed on the first insulating layer 130. The semiconductor layer 140A may include a channel region, a source region, and a drain region. The channel region overlaps the gate electrode 160G with the first insulating layer 130 therebetween to form a channel region between the source electrode 180S and the drain electrode 180D. The source region is electrically connected to the source electrode 180S through a contact hole which passes through the second insulating layer 150 and the third insulating layer 170. The drain region is electrically connected to the drain electrode 180D through a contact hole which passes through the second insulating layer 150 and the third insulating layer 170. A buffer layer 120 and the first insulating layer 130 may be disposed between the semiconductor layer 140A and the substrate 110. The buffer layer 120 delays the diffusion of moisture and/or oxygen which permeates the substrate 110. The first insulating layer 130 protects the semiconductor layer 140A and blocks various types of defects introduced from the substrate 110.

A top layer of the buffer layer 120 which is in contact with the first insulating layer 130 may be formed of a material having a different etching property from the remaining layers of the buffer layer 120, the first insulating layer 130, the second insulating layer 150, and the third insulating layer 170. The top layer of the buffer layer 120 which is in contact with the first insulating layer 130 may be formed of any one of silicon nitride SiNx and silicon oxide SiOx. The remaining layers of the buffer layer 120, the first insulating layer 130, the second insulating layer 150, and the third insulating layer 170 may be formed of the other one of silicon nitride SiNx and silicon oxide SiOx. For example, the top layer of the buffer layer 120 which is in contact with the first insulating layer 130 is formed of silicon nitride SiNx and the remaining layers of the buffer layer 120, the first insulating layer 130, the second insulating layer 150, and the third insulating layer 170 are formed of silicon oxide SiOx, but are not limited thereto.

The gate electrode 160G is formed on the second insulating layer 150 and overlaps the channel region of the semiconductor layer 140A with the second insulating layer 150 therebetween. The gate electrode 160G may be formed of a single layer or a multi-layered first conductive material formed of any one of magnesium (Mg), molybdenum (Mo), aluminum (Al), chrome (Cr), gold (Au), titanium (Ti), nickel (Ni), neodymium (Nd), and copper (Cu), or an alloy thereof, but is not limited thereto.

The source electrode 180S may be connected to the source region of the semiconductor layer 140A which is exposed through a contact hole which passes through the second insulating layer 150 and the third insulating layer 170. The drain electrode 180D is opposite to the source electrode 180S and may be connected to the drain region of the semiconductor layer 140A which is exposed through a contact hole which passes through the second insulating layer 150 and the third insulating layer 170. The source electrode 180S and the drain electrode 180D may be formed of a single layer or a multi-layered second conductive material formed of any one of molybdenum (Mo), aluminum (Al), chrome (Cr), gold (Au), titanium (Ti), nickel (Ni), neodymium (Nd), and copper (Cu), or an alloy of one or two or more thereof, but is not limited thereto.

A connection electrode 210C may be disposed between a first intermediate layer 200 and a second intermediate layer 220. The connection electrode 210C is exposed through a connection electrode contact hole 211C which passes through a protective layer 190 and the first intermediate layer 200 to be connected to the drain electrode 180D. The connection electrode 210C may be formed of a material having a low specific resistance, which is the same as or similar to the drain electrode 180D, but is not limited thereto.

Referring to FIG. 2, the light emitting diode 230 including a light emitting layer 232 may be disposed on the second intermediate layer 220 and the bank layer 240. The light emitting diode 230 may include a first driving electrode 231, at least one light emitting layer 232 formed on the first driving electrode 231, and a second driving electrode 233 formed on the light emitting layer 232.

The first driving electrode 231 may be electrically connected to the connection electrode 210C which is exposed through a contact hole which passes through the second intermediate layer 220 which is disposed on the first intermediate layer 200.

The first driving electrode 231 of each sub pixel is formed to be exposed by the bank layer 240. The bank layer 240 may be formed of an opaque material (for example, black) to suppress the light interference between adjacent sub pixels. In this case, the bank layer 240 may include a light shielding material which is formed of at least any one of a color pigment, organic black, and carbon, but is not limited thereto.

Referring to FIG. 2, at least one light emitting layer 232 may be formed on the first driving electrode 231 in an emission region provided by the bank layer 240. At least one light emitting layer 232 includes a hole transport layer, a hole injection layer, a hole blocking layer, an organic light emitting layer, an electron injection layer, an electron blocking layer, and an electron transport layer on the first driving electrode 231 and the layers may be laminated in this order or a reverse order in accordance with an emission direction. Further, the light emitting layer 232 may include first and second emission stacks which are opposite to each other with a charge generating layer therebetween. In this case, an organic light emitting layer of any one of the first and second emission stacks generates blue light and an organic light emitting layer of the other one of the first and second emission stacks generates yellow-green light so that white light may be generated by the first and the second emission stacks. The white light generated in the emission stack is incident onto a color filter located above or below the light emitting layer 232 to implement color images. As another example, the light emitting layers 232 generate color light corresponding to individual sub pixels without having separate color filters to implement color images. For example, the light emitting layer 232 of a red sub pixel may generate red light, the light emitting layer 232 of a green sub pixel may generate green light, and the light emitting layer 232 of a blue sub pixel may generate blue light.

Referring to FIG. 2, the second driving electrode 233 is formed to be opposite to the first driving electrode 231 with the light emitting layer 232 therebetween and is connected to the high potential (VDD) supply line.

An encapsulating layer 260 blocks moisture or oxygen from being permeated into the light emitting diode 230 which is vulnerable to the moisture or oxygen from the outside. To this end, the encapsulating layer 260 may include at least one inorganic encapsulating layer and at least one organic encapsulating layer, but is not limited thereto. In the present disclosure, a structure of the encapsulating layer 260 in which a first encapsulating layer 261, a second encapsulating layer 262, and a third encapsulating layer 263 are sequentially laminated will be described as an example.

The first encapsulating layer 261 is formed on the substrate 110 on which the second driving electrode 233 is formed. The third encapsulating layer 263 is formed on the substrate 110 on which the second encapsulating layer 262 is formed and encloses a top surface, a bottom surface, and a side surface of the second encapsulating layer 262 together with the first encapsulating layer 261. The first encapsulating layer 261 and the third encapsulating layer 263 may minimize or suppress the permeation of external moisture or oxygen into the light emitting diode 230. The first encapsulating layer 261 and the third encapsulating layer 263 are formed of an inorganic insulating material on which low-temperature deposition is allowed, such as silicon nitride SiNx, silicon oxide SiOx, silicon oxynitride SiON, or aluminum oxide $Al_2O_3$. The first encapsulating layer 261 and the third encapsulating layer 263 are deposited under a low temperature atmosphere so that the damage of the light emitting diode 230 which is vulnerable to a high temperature atmosphere may be suppressed during the deposition process of the first encapsulating layer 261 and the third encapsulating layer 263.

The second encapsulating layer 262 serves as a buffer which alleviates stress between layers due to the bending of the electroluminescent display device 1000 and planarizes the step between layers. The second encapsulating layer 262 may be formed of acryl resin, epoxy resin, phenolic resin, polyamide resin, polyimide resin, and polyethylene or a nonphotosensitive organic insulating material such as silicon oxy carbon (SiOC), or a photosensitive organic insulating material such as photoacryl, on the substrate 110 on which the first encapsulating layer 261 is formed, but is not limited thereto. When the second encapsulating layer 262 is formed using an inkjet method, a dam DAM may be disposed to suppress a liquefied second encapsulating layer 262 from being diffused to an edge of the substrate 110. The dam DAM may be disposed to be closer to the edge of the substrate 110 than the second encapsulating layer 262. The dam DAM may suppress the second encapsulating layer 262 from being diffused into a pad region where a conductive pad disposed at an outermost periphery of the substrate 110 is disposed.

The dam DAM is designed to suppress the diffusion of the second encapsulating layer 262. However, when the second encapsulating layer 262 is formed to exceed a height of the dam DAM during the process, the second encapsulating layer 262 which is an organic layer may be exposed to the outside so that moisture may be easily permeated into the light emitting diode. Therefore, in order to avoid the above-mentioned problem, at least two dams DAM may be repeatedly formed.

Referring to FIG. 2, the dam DAM may be disposed on the protective layer 190 of the non-display area NA.

Further, the dam DAM may be simultaneously formed with the first intermediate layer 200 and the second intermediate layer 220. When the first intermediate layer 200 is formed, a lower layer of the dam DAM is formed together and when the second intermediate layer 200 is formed, an upper layer of the dam DAM is formed together so that the dam DAM may be laminated to have a double-layered structure.

Therefore, the dam DAM may be configured with the same material as the first intermediate layer 200 and the second intermediate layer 220, but is not limited thereto.

Referring to FIG. 2, the dam DAM may be formed to overlap the power supply line VSS. For example, on a lower layer of a region of the non-display area NA where the dam DAM is located, the power supply line VSS may be formed.

The power supply line VSS and the gate driver GIP are formed to enclose the outer periphery of the display panel and the power supply line VSS may be located at the outer periphery more than the gate driver GIP. Further, the power supply line VSS is connected to the first driving electrode 231 to apply a common voltage. Even though the gate driver GIP is simply illustrated in a plan view and a cross-sectional view, the gate driver GIP may be configured using a thin film transistor TFT having the same structure as the thin film transistor TFT of the display area AA.

Referring to FIG. 2, the power supply line VSS is disposed at the outside more than the gate driver GIP. The power supply line VSS is disposed at the outside more than the gate driver GIP and encloses the display area AA. The power supply line VSS may be formed of the same material as the source electrode 180S and the drain electrode 180D of the thin film transistor TFT, but is not limited thereto. For example, the power supply line VSS may be formed of the same material as the gate electrode 160G.

Further, the power supply line VSS may be electrically connected to the first driving electrode 231. The power supply line VSS may supply a low potential voltage to the plurality of pixels PX of the display area AA.

Figure 3:
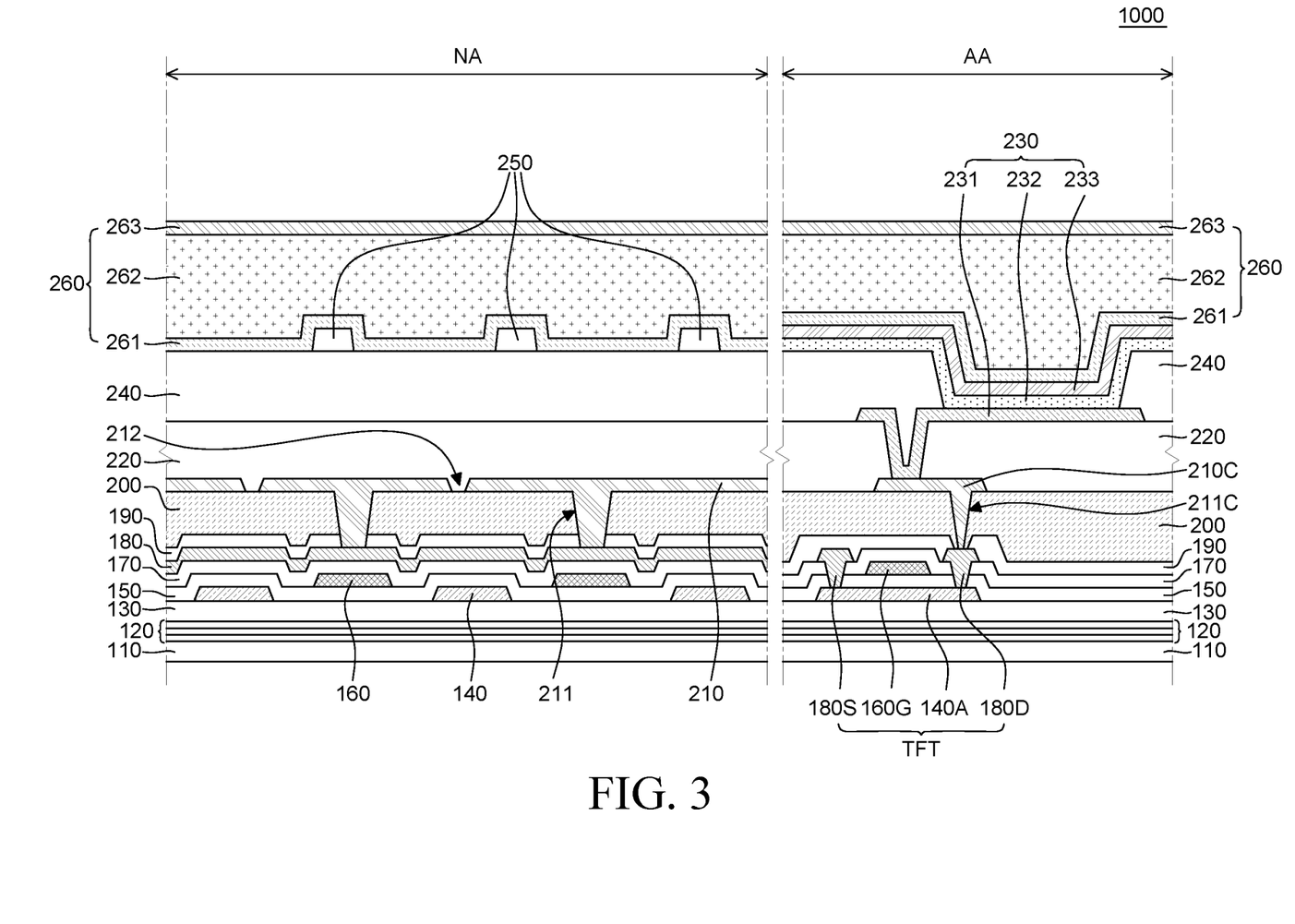
FIG. 3 is a cross-sectional view of an electroluminescent display device illustrating a non-display area and a display area of a direction where a pad is located.

FIG. 3 is a cross-sectional view of an electroluminescent display device 1000 illustrating a non-display area and a display area of a direction where a pad is located. Referring to FIG. 3, the electroluminescent display device 1000 according to the exemplary embodiment of the present disclosure may include a thin film transistor TFT, a light emitting diode 230, a substrate 110, a buffer layer 120, a first insulating layer 130, a second insulating layer 150, a third insulating layer 170, a protective layer 190, a first intermediate layer 200, a second intermediate layer 220, a connection electrode 210C, a bank layer 240, a spacer 250, and an encapsulating layer 260. The substrate 110 may support various components of the electroluminescent display device 1000.

In the non-display area NA, a pixel driving circuit and a light emitting diode are not disposed, but the substrate 110 and organic/inorganic layers 120, 130, 150, 170, 190, 200, and 220 may be provided. Further, in the non-display area NA, materials used for the configuration of the display area AA may be disposed for a different purpose. For example, a second wiring line 160 which is formed of the same metal as the gate electrode 160G of the thin film transistor TFT in the display area AA or the first electrode 180 which is formed of the same metal as the source electrode 180S and the drain electrode 180D may be disposed in the non-display area NA for a wiring line or an electrode. Moreover, the same metal 210 as the connection electrode 210C may be disposed in the non-display area NA for the wiring line or the electrode. Metals may be disposed on different layers and may be insulated from each other by a plurality of layers 120, 130, 150, 170, 190, 200, and 220. For example, the source electrode 180S and the drain electrode 180D may be used as the power supply lines VSS. The power supply line VSS is connected to the connection electrode 210C and the first driving electrode 231 of the light emitting diode 230 may be connected to the source electrode 180S, the drain electrode 180D, and the connection electrode 210C to be supplied with the power. The connection electrode 210C is in contact with the power supply line VSS and extends along an outermost side wall of the second intermediate layer 220 to be in contact with the first driving electrode 231 above the second intermediate layer 220.

The substrate 110 may be formed of a plastic material having flexibility. When the substrate 110 is formed of a plastic material, for example, the substrate may be formed of polyimide (PI), but is not limited thereto. When the substrate 110 is formed of polyimide (PI), the manufacturing process of the electroluminescent display device 1000 is performed under a circumstance when a support substrate formed of glass is disposed below the substrate 110 and the support substrate may be released after completing the manufacturing process of the electroluminescent display device 1000. Further, after releasing the support substrate, a back plate which supports the substrate 110 may be disposed below the substrate 110. However, it is not limited thereto, and in some cases, the support substrate which is formed of glass may be used as it is.

Referring to FIG. 3, the buffer layer 120 having a single layer or a multi-layered structure may be disposed on the substrate 110. The buffer layer 120 disposed on the substrate 110 may be formed by a single layer of silicon nitride SiNx or silicon oxide SiOx or a multilayer in which silicon nitride and silicon oxide are alternately formed.

The buffer layer 120 enhances adhesiveness between the layers formed on the buffer layer 120 and the substrate 110 and protects the thin film transistor TFT from impurities such as alkali ions leaked from the substrate 110 or layers therebelow. Further, the buffer layer 120 may be configured by silicon oxide (SiOx), silicon nitride (SiNx), or multilayers thereof, but is not limited thereto. The buffer layer 120 may include a multi buffer and/or an active buffer. Further, the buffer layer 120 is not an essential component and may be omitted based on a type and a material of the substrate 110 and a structure and a type of the thin film transistor TFT.

Referring to FIG. 3, in the display area AA of the substrate 110, the thin film transistor TFT for driving the light emitting diode 230 may be disposed on the buffer layer 120. A first insulating layer 130 is further disposed between the thin film transistor TFT and the buffer layer 120 to more stably form the thin film transistor TFT.

The thin film transistor TFT includes a semiconductor layer 140A, a gate electrode 160G, a source electrode 180S, and a drain electrode 180D. Here, depending on the design of the pixel circuit, the source electrode 180S may serve as a drain electrode and the drain electrode 180D may serve as a source electrode. In the display area AA of the substrate 110, the semiconductor layer 140A of the thin film transistor TFT may be disposed on the first insulating layer 130.

The semiconductor layer 140A may include a low temperature poly silicon (LTPS). The polysilicon material has a high mobility (100 $cm^2$/Vs or higher) so that energy power consumption is low and reliability is excellent. Therefore, the polysilicon material may be applied to a gate driver for driving elements which drive thin film transistors for a display element and/or a multiplexer (MUX) and also applied as a semiconductor layer 140A of a driving thin film transistor of the electroluminescent display device 1000 according to the exemplary embodiment of the present disclosure, but is not limited thereto. For example, the polysilicon material may be applied as a semiconductor layer of a switching thin film transistor depending on the characteristics of the electroluminescent display device 1000. An amorphous silicon (a-Si) material is deposited on the first insulating layer 130 and a dehydrogenation process and a crystallization process are performed to form polysilicon and the polysilicon is patterned to form the semiconductor layer 140A.

The semiconductor layer 140A may include a channel region 140C in which a channel is formed at the time of driving the thin film transistor TFT and a source region 140S and a drain region 140D on both sides of the channel region 140C. The source region 140S may be a part of the semiconductor layer 140A connected to the source electrode 180S and the drain region 140D may be a part of the semiconductor layer 140A connected to the drain electrode 180D. The source region 140S and the drain region 140D may be configured by ion doping, for example, impurity doping of the semiconductor layer 140A. The source region 140S and the drain region 140D may be produced by doping ions into the polysilicon material and the channel region 140C may be a part which is not doped with ion and remains with the polysilicon material.

The semiconductor layer 140A may be formed of oxide semiconductor. The oxide semiconductor material has a large band gap as compared with a silicon material so that electrons cannot jump over the band gap in an off state. Therefore, the oxide semiconductor material has a low off-current. Therefore, the thin film transistor including a semiconductor layer which is formed of an oxide semiconductor is suitable for a switching thin film transistor which maintains a short on-time and a long off-time, but is not limited thereto. The semiconductor layer may be applied as a driving thin film transistor depending on the characteristics of the electroluminescent display device 1000. Further, due to the low off-current, a magnitude of an auxiliary capacitance may be reduced so that the thin film transistor may be appropriate for a high resolution display element. For example, the semiconductor layer 140A may be formed of metal oxide and for example, may be formed of various metal oxide such as indium-gallium-zinc-oxide (IGZO). Under assumption that the semiconductor layer 140A of the thin film transistor TFT is formed based on an IGZO layer, among various metal oxides, it has been described that the active layer is formed based on the IGZO layer, but it is not limited thereto. Therefore, the semiconductor layer may be formed of another metal oxide such as indium-zinc-oxide (IZO), indium-gallium-tin-oxide (IGTO), or indium-gallium-oxide (IGO), other than IGZO. The semiconductor layer 140A may be formed by depositing the metal oxide on the first insulating layer 130, performing a heat treatment for stabilization, and then patterning the metal oxide.

Referring to FIG. 3, the semiconductor layer 140A may be formed as a first wiring line 140 in the non-display area NA. The first wiring line 140 may be a part of a component of a gate driver GIP disposed on the first insulating layer 130 and disposed on the same layer and formed of the same material as the semiconductor layer 140A of the thin film transistor TFT, but is not limited thereto.

A second insulating layer 150 may be disposed on the first insulating layer 130 to cover a top surface of the semiconductor layer 140A of the thin film transistor TFT. The second insulating layer 150 may be configured as a single layer of silicon nitride SiNx or silicon oxide SiOx or a multi-layer thereof. In the second insulating layer 150, contact holes through which the source electrode 180S and the drain electrode 180D of the thin film transistor TFT are connected to the source region 140S and the drain region 140D of the semiconductor layer 140A of the thin film transistor TFT, respectively, may be formed.

Referring to FIG. 3, in the display area AA, the second insulating layer 150 may be disposed on the semiconductor layer 140A. Further, in the non-display area NA, the second insulating layer 150 may be disposed on the first insulating layer 130. As illustrated in FIG. 3, the second insulating layer 150 may be formed over the entire substrate, but it is not limited thereto. For example, the second insulating layer 150 may be patterned to have the same width as the gate electrode 160G.

In the display area AA of the substrate 110, a gate electrode 160G of the thin film transistor TFT, a gate line GL connected to the gate electrode 160G, and a first capacitor electrode of a storage capacitor may be disposed on the second insulating layer 150. The gate electrode 160G, the gate line GL, and the first capacitor electrode may be formed as a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof, but are not limited thereto. The gate electrode 160G may be formed on the second insulating layer 150 so as to overlap the channel region 140C of the semiconductor layer 140A of the thin film transistor TFT.

Referring to FIG. 3, the gate electrode 160G may be formed as a second wiring line 160 in the non-display area NA. The second wiring line 160 may be a part of a component of the gate driver GIP disposed on the second insulating layer 150 and disposed on the same layer and formed of the same material as the gate electrode 160G of the thin film transistor TFT.

Referring to FIG. 3, a third insulating layer 170 may be disposed on the second insulating layer 150 so as to cover the gate electrode 160G and the gate line GL of the display area AA and the second wiring line 160 of the non-display area NA. The third insulating layer 170 may be configured as a single layer of silicon nitride SiNx or silicon oxide SiOx or a multi-layer thereof. Contact holes through which the source region 140S and the drain region 140D of the semiconductor layer 140A of the thin film transistor TFT are exposed may be formed in the third insulating layer 170. Further, as illustrated in FIG. 3, the third insulating layer 170 may be formed over the entire substrate, but is not limited thereto. For example, the third insulating layer 170 may be patterned to have the same width as the semiconductor layer 140A.

In the display area AA of the substrate 110, the source electrode 180S and the drain electrode 180D of the thin film transistor TFT may be disposed on the third insulating layer 170. The source electrode 180S and the drain electrode 180D of the thin film transistor TFT may be connected to the semiconductor layer 140A of the thin film transistor TFT through the contact hole formed in the second insulating layer 150 and the third insulating layer 170. Therefore, the source electrode 180S of the thin film transistor TFT may be connected to the source region 140S of the semiconductor layer 140A through the contact holes formed in the second insulating layer 150 and the third insulating layer 170. Further, the drain electrode 180D of the thin film transistor TFT may be connected to the drain region 140D of the semiconductor layer 140A through the contact holes formed in the second insulating layer 150 and the third insulating layer 170. The source electrode 180S and the drain electrode 180D may be any one of molybdenum (Mo), copper (Cu), titanium (Ti), aluminum (Al), chrome (Cr), gold (Au), nickel (Ni), and neodymium (Nd) or an alloy thereof and formed a single layer or a multilayer. For example, the source electrode 180S and the drain electrode 180D may be formed by a triple structure of titanium (Ti)/aluminum (Al)/titanium (Ti) formed of a conductive metal material. The materials of the source electrode 180S and the drain electrode 180D are not limited to the above-described matter. In FIG. 3, even though only a driving thin film transistor is illustrated among various thin film transistors which may be included in the electroluminescent display device 1000 for the convenience of description, another thin film transistor such as a switching thin film transistor may also be included in the electroluminescent display device 1000. Further, in the present disclosure, even though it is described that the thin film transistor 120 has a coplanar structure, the thin film transistor may be implemented to have another structure such as a staggered structure.

Referring to FIG. 3, in the non-display area NA of the substrate 110, a first electrode 180 which serves as a part of a gate driver GIP may be disposed on the third insulating layer 170. The first electrode 180 may be disposed on the same layer as the source electrode 180S and the drain electrode 180D of the thin film transistor TFT and may be formed of the same material. As illustrated in FIG. 3, the gate driver GIP may be configured by various components such as the first wiring line 140, the second wiring line 160, and the first electrode 180. The first electrode 180 is electrically connected to the power supply line VSS and the first driving electrode 231 to supply a power to the first driving electrode 231, which will be described below.

Referring to FIG. 3, in the display area AA and the non-display area NA, the protective layer 190 may be disposed on the thin film transistor TFT, the first electrode 180, and the gate driver GIP. The protective layer 190 may be disposed so as to cover the thin film transistor TFT, the first electrode 180, and the gate driver GIP. The protective layer 190 may be formed as a single layer of silicon nitride SiNx or silicon oxide SiOx or a multi-layer thereof. In the display area AA, a contact hole through which the drain electrode 180D of the thin film transistor TFT is exposed may be formed in the protective layer 190. Further, in the non-display area NA, a contact hole through which the first electrode 180 is exposed may be formed in the protective layer 190.

The first intermediate layer 200 is an insulating layer which protects the thin film transistor TFT, the gate driver GIP, and various wiring lines or electrodes and alleviates a step on the substrate 110 to allow a surface of an upper portion of the substrate 110 to have a uniform height.

Referring to FIG. 3, the first intermediate layer 200 may be disposed in both the display area AA and a non-display area NA. In the display area AA and the non-display area NA, the first intermediate layer 200 may be disposed on the protective layer 190 so as to overlap the thin film transistor 120 of the display area AA and the gate driver GIP of the non-display area NA. For example, as illustrated in FIG. 3, the first intermediate layer 200 may be disposed in a region of the display area AA and the non-display area NA where the gate driver GIP is located. Further, in the region where the first electrode 180 is located, a part of the first intermediate layer 200 is removed to form a contact hole through which the first electrode 180 is exposed.

The first intermediate layer 200 may be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but is not limited thereto.

The thinner the first intermediate layer 200, the more advantageous for the process. However, a thickness of the first intermediate layer 200 may have a value in the range of at least 1 um to 5 um so as to maintain an appropriate interval between the first electrode 180 and the second electrode 210 and fill the curvature of the first electrode 180.

Referring to FIGS. 2 and 3, the first intermediate layer 200 may be disposed so as to cover the thin film transistor TFT and the gate driver GIP. In the display area AA, a contact hole through which the drain electrode 180 is exposed may be formed in the first intermediate layer 200. Further, in the non-display area NA, a contact hole which exposes the protective layer 190 disposed on the first electrode 180 to the second electrode 210 may be formed in the first intermediate layer 200. The first intermediate layer 200 is an organic material layer which protects the thin film transistor TFT and the gate driver GIP and alleviates a step on the substrate 110 to allow a surface of an upper portion of the substrate 110 to have a uniform height. For example, the first intermediate layer 200 may be formed of an organic material such as acryl resin, epoxy resin, phenolic resin, polyamide resin, or polyimide resin, but is not limited thereto.

Referring to FIG. 3, a connection electrode 210C may be disposed on the first intermediate layer 200 in the display area AA of the substrate 110. Further, the connection electrode 210C may be connected to the drain electrode 180D of the thin film transistor TFT through the contact holes of the first intermediate layer 200 and the protective layer 190 which expose the drain electrode 180D. The connection electrode 210C may serve to electrically connect the thin film transistor TFT and the light emitting diode 230. For example, the connection electrode 210C may serve to electrically connect the drain electrode 180D of the thin film transistor TFT and the first driving electrode 231 of the light emitting diode 230. The connection electrode 210C may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof, but is not limited thereto. The connection electrode 210C may be formed of the same material as the source electrode 180S and the drain electrode 180D of the thin film transistor TFT.

In the non-display area NA of the substrate 110, the second electrode 210 may be disposed on the first intermediate layer 200. Further, the second electrode 210 may be connected to the first electrode 180 through a second electrode contact hole 211 of the first intermediate layer 200 and the protective layer 190 which exposes the first electrode 180. The second electrode 210 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof, but is not limited thereto. The second electrode 210 may be formed on the same layer as the connection electrode 210C or the source electrode 180S and the drain electrode 180D of the thin film transistor TFT and formed of the same material, but is not limited thereto.

Referring to FIGS. 1 and 3, in the non-display area NA of the substrate 110, the second electrode 210 may be configured as a lattice form having at least one opening 212.

The region 'A' enlarged in FIG. 1 may be a component of the second electrode 210 according to the exemplary embodiment of the present disclosure. Unlike the first electrode 180 formed on the entire non-display area NA, the second electrode 210 may be configured to have a lattice form with at least one opening 212 which exposes the first intermediate layer 200.

Since the second electrode 210 is formed to have a lattice form, the first intermediate layer 200 and the second intermediate layer 220 may be in contact with each other through the opening 212. As the first intermediate layer 200 and the second intermediate layer 220 are in contact with each other, as compared with a case in which the opening 212 is not formed in the second electrode, but is formed on the entire non-display area NA like the first electrode 180, the adhesiveness is improved. Therefore, defects such as tearing or loosening of the second electrode 210 may be significantly reduced.

Further, the lattice structure of the second electrode 210 forms the opening 212 without completely blocking the second electrode 210 formed of an inorganic material on the first intermediate layer 200 formed of the organic material during the forming of the second electrode. Therefore, outgassing of the electroluminescent display device 1000 is improved.

Referring to FIG. 3, in the first intermediate layer 200 and the protective layer 190 disposed below the second electrode 210, a plurality of electrode contact holes 211 which passes the second electrode 210 is formed. The second electrode 210 may be electrically connected to the first electrode 180 through the second electrode contact hole 211.

As the first electrode 180 and the second electrode 210 which are used as signal lines in the non-display area NA are electrically connected to each other, as compared with a case in which the first electrode 180 or the second electrode 210 is formed as an individual wiring line, the resistance may be lowered. Therefore, an image quality may be improved.

Further, in the second electrode 210, at least one opening 212 may be alternately and repeatedly formed with the second electrode contact hole 211.

Referring to FIG. 3, the second intermediate layer 220 may be disposed on the connection electrode 210C and the first intermediate layer 200 in the display area AA of the substrate 110. For example, the second intermediate layer 220 may be disposed so as to cover the connection electrode 210C on the first intermediate layer 200. Further, as illustrated in FIG. 3, a contact hole may be formed in the second intermediate layer 220 to expose the connection electrode 210C. The second intermediate layer 220 may be an organic material layer which further alleviates the step of a lower structure due to the connection electrode 210C on the first intermediate layer 200 and additionally protects the lower structure. For example, the second intermediate layer 220 may be formed of an organic material such as acryl resin, epoxy resin, phenolic resin, polyamide resin, or polyimide resin, but is not limited thereto. The second intermediate layer 220 may be formed of the same material as the first intermediate layer 200, but is not limited thereto.

Further, in the non-display area NA of the substrate 110, the second intermediate layer 220 may be disposed to cover the second electrode 210. As illustrated in FIG. 3, the second intermediate layer 220 may be formed to be in contact with the first intermediate layer 200 along the opening 212 of the second electrode 210. As the first intermediate layer 200 and the second intermediate layer 220 are in contact with each other in the opening 212 of the second electrode 210, the adhesiveness is improved so that defects due to the loosening of the second electrode 210 may be reduced.

In the electroluminescent display device 1000 according to the exemplary embodiment of the present disclosure, as an insulating layer which alleviates the step generated in the layer above the thin film transistor TFT in the display area AA to allow the surfaces above the substrate 110 to have a uniform height, the first intermediate layer 200 and the second intermediate layer 220 may be configured in the display area AA. Therefore, an addition space for disposing various wiring lines used for the display area AA of the electroluminescent display device 1000 may be provided.

For example, as compared with a case in which one intermediate layer is used in the display area AA, a space between the first intermediate layer 200 and the second intermediate layer 220, that is, an additional space for disposing wiring lines on a top surface of the first intermediate layer 200 may be provided. Therefore, in the electroluminescent display device 1000 according to the exemplary embodiment of the present disclosure, a degree of freedom of design for wiring line arrangement may be increased. As a result, an electroluminescent display device 1000 having a higher resolution may be provided and a luminance irregularity problem which may be caused by the high resistance of a wiring line disposed in the display area AA of the electroluminescent display device 1000 may be solved.

Further, in the electroluminescent display device 1000 according to the exemplary embodiment of the present disclosure, as an insulating layer which alleviates the step generated in the layer above the first electrode 180 in the non-display area NA to allow the surfaces of the upper portion of the substrate 110 to have a uniform height, the first intermediate layer 200 and the second intermediate layer 220 may be configured in the display area AA. Accordingly, in the non-display area NA of the electroluminescent display device 1000, light reflection due to a specific viewing angle may be avoided.

In other words, as compared with a case in which only one intermediate layer is used in the non-display area NA, the step or curvature above the first electrode 180 may be offset by the first intermediate layer 200 and the second intermediate layer 220 which are formed to have a double-layered structure. Therefore, even though light incident from the outside is reflected from the second electrode 210, the light is inwardly reflected so that the failure that the user at the outside recognizes the reflected light may be solved.

Referring to FIG. 3, the first driving electrode 231 of the light emitting diode 230 may be disposed on the second intermediate layer 220. The first driving electrode 231 may be electrically connected to the connection electrode 210C through the contact hole formed in the second intermediate layer 220. Therefore, the first driving electrode 231 is connected to the connection electrode 210C through the contact hole formed in the second intermediate layer 220 to be electrically connected to the thin film transistor TFT.

The first driving electrode 231 may be formed to have a multi-layered structure including a transparent conductive layer and an opaque conductive layer having high reflection efficiency. The transparent conductive layer may be formed of a material having a high work function such as indium tin oxide (ITO) or indium zinc oxide (IZO). Further, the opaque conductive layer may be formed to have a single layer or a multi-layered structure including Al, Ag, Cu, Pb, Mo, and Ti, or an alloy thereof. For example, the first driving electrode 231 may be formed to have a structure in which a transparent conductive layer, an opaque conductive layer, and a transparent conductive layer are sequentially laminated. However, the first electrode 141 is not limited thereto but may also be formed to have a structure in which the transparent conductive layer and the opaque conductive layer are sequentially laminated.

The electroluminescent display device 1000 according to the exemplary embodiment of the present disclosure may be a top emission type electroluminescent display device 1000 or a bottom emission type electroluminescent display device 1000. Therefore, the first driving electrode 231 disposed on the second intermediate layer 220 may be a cathode electrode and the first driving electrode 231 may be an anode electrode.

Referring to FIG. 3, the bank layer 240 is a structure which distinguishes adjacent pixels PX in the display area AA and defines a plurality of pixels PX. The bank layer 240 may be formed of an organic material. The bank layer 240 may be disposed on the first driving electrode 231 and the second intermediate layer 220.

In the display area AA, an opening which exposes the first driving electrode 231 may be formed in the bank layer 240. Since the bank layer 240 defines an emission region of the electroluminescent display device 1000, the bank layer 240 may also be referred to as a pixel definition layer. The bank layer 240 may be disposed so as to cover both ends of the first driving electrode 231.

A spacer 250 may be further disposed on the bank layer 240. Further, in the non-display area NA, a contact hole through which the connection electrode 210C is exposed may be formed in the bank layer 240.

The bank layer 240 and the spacer 250 may be formed of the same material. Further, the bank layer 240 and the spacer 250 may be formed of an organic material. For example, the bank layer 240 and the spacer 250 may be formed of polyimide, acryl, or benzocyclobutene (BCB)-based resin, but are not limited thereto.

Further, a light emitting diode 230 including a light emitting layer 232 may be further disposed on the second intermediate layer 220 and the bank layer 240. Even though in FIG. 3, it is illustrated that the light emitting layer 232 is patterned for every pixel PX, the present disclosure is not limited thereto and the light emitting layer 232 may be a common layer which is commonly formed for the plurality of pixels PX. The light emitting layer 232 includes a hole transport layer, a hole blocking layer, a hole injection layer, an organic light emitting layer, an electron injection layer, an electron blocking layer, and an electron transport layer on the first driving electrode 231 and the layers may be laminated in this order or a reverse order in accordance with an emission direction. Further, the light emitting layer 232 may include first and second emission stacks which are opposite to each other with a charge generating layer therebetween. In this case, any one light emitting layer of the first and second emission stacks generates blue light and the other light emitting layer of the first and second emission stacks generates yellow-green light so that white light may be generated by the first and the second emission stacks. The white light generated in the light emitting layer 232 is incident onto a color filter disposed above the light emitting layer 232 to implement color images. In addition, the light emitting layers 232 generate color light corresponding to individual sub pixels without having separate color filters to implement color images. For example, the light emitting layer 232 of a red R sub pixel may generate red light, the light emitting layer 232 of a green G sub pixel may generate green light, and the light emitting layer 232 of a blue B sub pixel may generate blue light.

The second driving electrode 233 may be further disposed on the light emitting layer 232. The second driving electrode 233 may be disposed on the light emitting layer 232 so as to be opposite to the first driving electrode 231 with the light emitting layer 232 therebetween.

The electroluminescent display device 1000 according to the exemplary embodiment of the present disclosure may be a top emission type electroluminescent display device 1000 or a bottom emission type electroluminescent display device 1000. Therefore, the second driving electrode 233 disposed on the second intermediate layer 220 may be a cathode electrode and the first driving electrode 231 may be an anode electrode.

Referring to FIG. 3, an encapsulating layer 260 may be disposed on the light emitting diode 230 in the display area AA of the substrate 110. For example, the encapsulating layer 260 may be further disposed on the second driving electrode 233 to suppress moisture permeation.

The encapsulating layer 260 suppresses the permeation of the oxygen and moisture from the outside to suppress the oxidation of a light emitting material and an electrode material. When the organic light emitting element is exposed to the moisture or oxygen, pixel shrinkage phenomenon in which the light emitting area is reduced is caused or a dark spot is generated in the light emitting area. The encapsulating layer 260 may be formed of an inorganic film formed of glass, metal, aluminum oxide AlOx, or silicon (Si) based material or have a structure in which organic films and inorganic films are alternately laminated. The inorganic film serves to block permeation of moisture or oxygen and the organic film serves to planarize a surface of the inorganic film to have a uniform height. When the encapsulating layer is formed by a plurality of thin film layers, a movement path of moisture or oxygen is longer and more complex than that of a single layer so that it is difficult for the moisture/oxygen to permeate into the organic light emitting element.

Referring to FIG. 3, in the electroluminescent display device 1000 according to the exemplary embodiment of the present disclosure, the encapsulating layer 260 may include a first encapsulating layer 261, a second encapsulating layer 262, and a third encapsulating layer 263. The first encapsulating layer 261 of the encapsulating layer 260 may be disposed on the second driving electrode 233. Further, the second encapsulating layer 262 may be disposed on the first encapsulating layer 261. Further, the third encapsulating layer 263 may be disposed on the second encapsulating layer 262. The first encapsulating layer 261 and the third encapsulating layer 263 of the encapsulating layer 260 may be formed of an inorganic material such as silicon nitride SiNx or silicon oxide SiOx. The second encapsulating layer 262 of the encapsulation unit may be formed of an organic material such as acryl resin, epoxy resin, phenolic resin, polyamide resin, or polyimide resin, but is not limited thereto.

Figure 4:
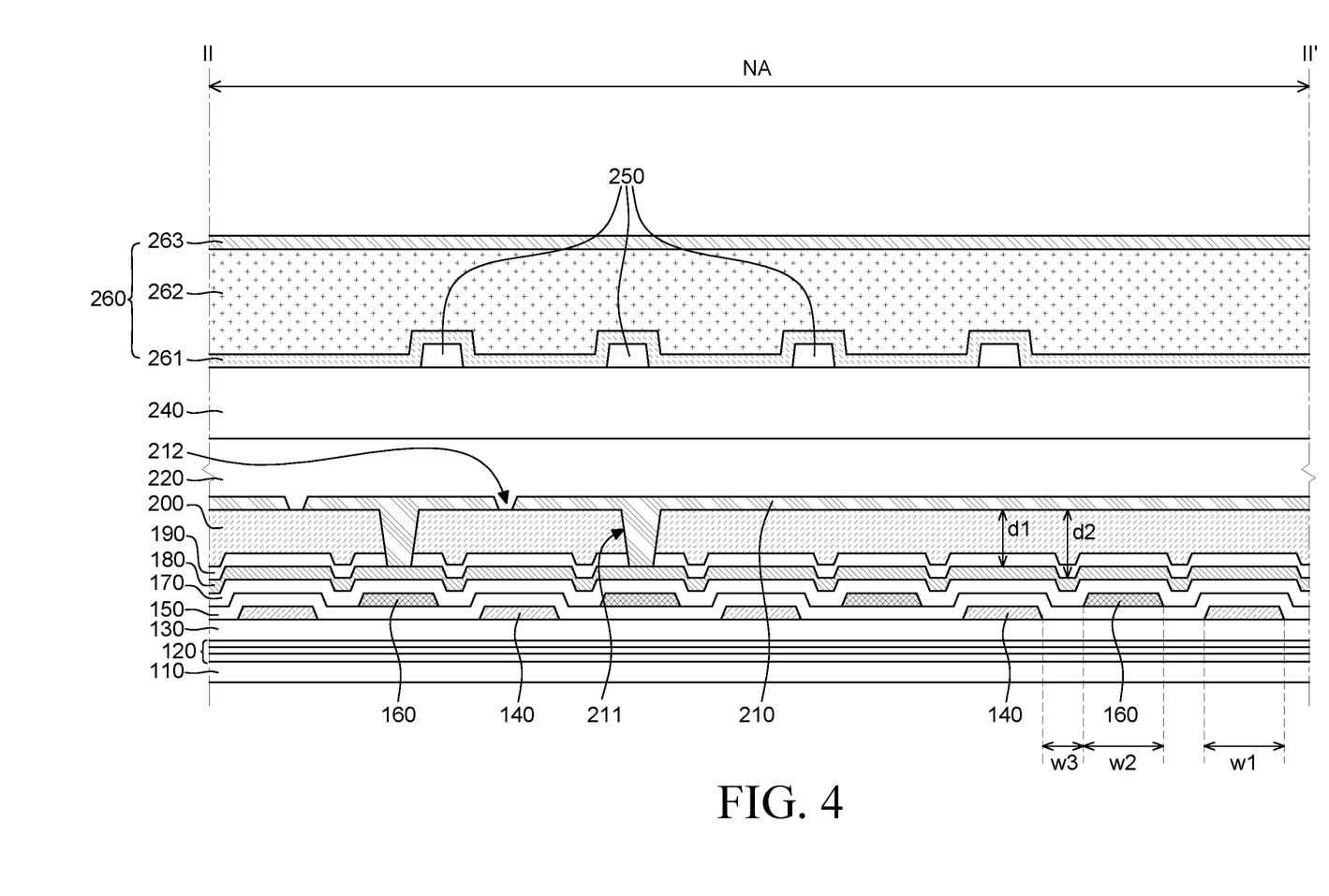
FIG. 4 is a cross-sectional view of an electroluminescent display device taken along the line II-II' of a region A of FIG. 1C.

FIG. 4 is a cross-sectional view illustrating the electroluminescent display device 1000 taken along the line II-II' of a region A of FIG. 1C.

FIG. 4 is a view enlarging a part A illustrated in FIG. 1 so that only some layers of a bezel region of a bottom area are illustrated and the other lines (for example, a power line) and layers are omitted. However, the structure of the display area and the non-display area illustrated in FIG. 3 may be applied to FIG. 4.

In FIG. 4, the same component as a non-display area in a direction in which the pad illustrated in FIG. 3 is located may be provided. Therefore, a detailed description for the same components on the display area will be omitted.

Referring to FIG. 4, in the electroluminescent display device 1000 according to the exemplary embodiment of the present disclosure, in the non-display area NA, a width W1 of the first wiring line 140 may be equal to or different from a width W2 of the second wiring line 160. The first wiring line 140 may be a semiconductor layer 140A of a thin film transistor TFT in the display area AA and the second wiring line 160 may be a gate electrode 160G. Accordingly, the width W1 of the first wiring line 140 may be formed to be larger than the width W2 of the second wiring line 160. However, in the non-display area NA, the first wiring line 140 and the second wiring line 160 are a path for signal transmission and are independent of the operation of the semiconductor layer 140A or the gate electrode 160G of the thin film transistor TFT. Therefore, the width W1 of the first wiring line and the width W2 of the second wiring line may be formed to be same.

Referring to FIG. 4, in the electroluminescent display device 1000 according to the exemplary embodiment of the present disclosure, in the non-display area NA, an interval W3 between the first wiring line 140 and the second wiring line 160 may be formed to be equal to or different from the width W1 of the first wiring line 140 or the width W2 of the second wiring line. In general, the longer the distance between the first wiring line 140 and the second wiring line 160, the more advantageous the signal interference. Further, in order to suppress an undesired parasitic capacitance from being generated, a predetermined or larger interval may be necessary between the wiring lines. However, in the electroluminescent display device 1000 having a high resolution, a plurality of signal lines needs to be disposed so that even though the signal lines are separately disposed on two layers, the signal lines may be disposed to have an interval therebetween as small as possible. Further, the larger the areas of the first wiring line 140 and the second wiring line 160, the more advantageous the signal transmission. Therefore, the interval W3 between the first wiring line 140 and the second wiring line 160 may be formed to be equal to or smaller than the width W1 of the first wiring line 140 or the width W2 of the second wiring line 160.

Referring to FIG. 4, in the electroluminescent display device 1000 according to the exemplary embodiment of the present disclosure, a distance between the first electrode 180 and the second electrode 210 on an area where the first wiring line 140 or the second wiring line 160 is disposed in a section adjacent to the second electrode contact hole 211 of the non-display area NA or the display area AA where the opening 212 is not formed may be smaller than a distance between the first electrode 180 and the second electrode 210 on an area where the first wiring line 140 or the second wiring line 160 is not disposed. In other words, the first electrode 180 is formed along the third insulating layer 170 which is formed to cover the first wiring line 140 and the second wiring line 160 so that the first electrode 180 may be formed to have a step or curvature in an area between the first wiring line 140 and the second wiring line 160.

In contrast, the second electrode 210 formed on the first intermediate layer 200 has a uniform height on a surface above the first intermediate layer 200 so that a top surface of the second electrode 210 may be formed to have a uniform height without having a step or curvature, unlike the first electrode 180.

Therefore, the distance between the first electrode 180 and the second electrode 210 on the area between the first wiring line 140 and the second wiring line 160 may be larger than the distance between the first electrode 180 and the second electrode 210 on the area where the first wiring line 140 or the second wiring line 160 is disposed.

Referring to FIG. 4, in the electroluminescent display device 1000 according to the exemplary embodiment of the present disclosure, the first electrode 180 may be formed along the first wiring line 140 and the second wiring line 160 which are alternately disposed on different layers in the non-display area NA.

Since the first electrode 180 is disposed along the first wiring line 140 and the second wiring line 160 which are disposed to be spaced apart from each other, the first electrode 180 may be formed to have a step or curvature. Accordingly, the first electrode 180 may have a groove (e.g., an indentation) on a top surface along the step in a space between the first wiring line 140 and the second wiring line 160. A depth of an upper groove of the first electrode 180 may be equal to or smaller than the height of the second wiring line 160 and a width of the upper groove of the first electrode 180 may be smaller than an interval W3 between the first wiring line 140 and the second wiring line 160.

Accordingly, the first electrode 180 may have a protrusion on a bottom surface along the step in the space between the first wiring line 140 and the second wiring line 160. A height of a lower protrusion of the first electrode 180 may be equal to or smaller than the height of the second wiring line 160 and a width of the lower protrusion of the first electrode 180 may be smaller than an interval W3 between the first wiring line 140 and the second wiring line 160.

The exemplary embodiments of the present disclosure can also be described as follows:

According to an aspect of the present disclosure, there is provided an electroluminescent display device. The electroluminescent display device, comprising: a substrate having an emission region and a bezel region; a bank layer which extends from the emission region to be disposed in the bezel region; a plurality of signal lines which is disposed on different layers on the substrate and has a step; a first metal layer which overlaps the plurality of signal lines and is disposed to be adjacent to the substrate; a second metal layer which is disposed on the first metal layer to be adjacent to the bank layer; and a first intermediate layer between the first metal layer and the second metal layer.

The second metal layer may be disposed to suppress reflection of external light.

The second metal layer may be electrically connected to the first metal layer.

The second metal layer may have a mesh shape.

The plurality of signal lines may include a first signal line and a second signal line.

The electroluminescent display device may further comprising: an insulating layer which is disposed between the first signal line and the second signal line, wherein the first signal line and the second signal line are disposed to be spaced apart from each other.

The first metal layer may be disposed along a step in a position where the first signal line and the second signal line are spaced apart from each other and a top surface of the first metal layer has a groove.

The depth of the groove of the first metal layer may be equal to or smaller than a height of the second signal line.

The width of the groove of the first metal layer may be smaller than an interval between the first signal line and the second signal line.

The first metal layer may include a protrusion from a bottom surface of the first metal layer in a position where the first signal line and the second signal line are spaced apart from each other.

The height of the protrusion of the first metal layer may be equal to or smaller than a height of the second signal line.

The width of the protrusion of the first metal layer may be smaller than an interval between the first signal line and the second signal line.

The electroluminescent display device may further comprising: a second intermediate layer below the bank layer.

The second intermediate layer may be in contact with the first intermediate layer.

According to another aspect of the present disclosure, there is provided an electroluminescent display apparatus. The electroluminescent display device, comprising: a substrate including a display area and a non-display area which encloses the display area; a plurality of signal lines disposed on the substrate; a first metal layer which is disposed to be bent to cover the plurality of signal lines in the non-display area; and a second metal layer on the first metal layer, wherein a distance between the first metal layer and the second metal layer is different between the plurality of signal lines.

The plurality of signal lines may include a first signal line and a second signal line and the first signal line and the second signal line are alternately disposed.

The first signal line and the second signal line may be disposed to be spaced apart from each other and a distance between the first metal layer and the second metal layer between the first signal line and the second signal line is larger than a distance between the first metal layer and the second metal layer in a position where the first signal line and the second signal line are spaced apart from each other.

The first intermediate layer may be disposed between the first metal layer and the second metal layer and the first intermediate layer alleviates a curvature on the first metal layer.

The width of each of the plurality of signal lines may be smaller than a width between the plurality of signal lines.

The electroluminescent display device may further comprising: a second intermediate layer which is disposed on the second metal layer and is in contact with the first intermediate layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
a substrate including a display area and a non-display area that is adjacent to the display area;
a transistor disposed in the display area on the substrate, the transistor including a semiconductor layer, a gate electrode, a source electrode, and a drain electrode;
a connection electrode connected to the drain electrode in the display area;
a light emitting diode disposed in the display area, the light emitting diode including a first driving electrode connected to the connection electrode, at least one light emitting layer, and a second driving electrode;
a plurality of signal lines disposed on a same layer as the semiconductor layer and the gate electrode in the non-display area;
a first intermediate layer disposed on the plurality of signal lines and the transistor;
a plurality of metal layers disposed on the plurality of signal lines, a metal layer from the plurality of metal layers disposed on a same layer as one of the source electrode and the drain electrode in the non-display area and another metal layer from the plurality of metal layers including a plurality of openings;
a second intermediate layer disposed on the metal layer, the second intermediate layer connected to the first intermediate layer though the plurality of openings in the in the non-display area; and
a protective layer disposed between the plurality of signal lines and the first intermediate layer, the protective layer including a plurality of contact holes exposing the metal layer, and
wherein the metal layer is connected to the other the metal layer though the plurality of contact holes.

2. The electroluminescent display device according to claim 1, wherein the plurality of signal lines are formed of a same material as at least one of the semiconductor layer or the gate electrode.

3. The electroluminescent display device according to claim 1, wherein the metal layer is formed of a same material as at least one of the source electrode or the drain electrode.

4. The electroluminescent display device according to claim 1, wherein the plurality of metal layers include a first metal layer and a second metal layer on the first metal layer, and the second metal layer is electrically connected to the first metal layer.

5. The electroluminescent display device according to claim 4, wherein the first metal layer is disposed along a step in an insulating layer, and a first surface of the first metal layer includes a groove.

6. The electroluminescent display device according to claim 5, wherein a depth of the groove of the first metal layer is less than or equal to a thickness of the signal line.

7. The electroluminescent display device according to claim 5, wherein a width of the groove of the first metal layer is less than an interval between the signal line.

8. The electroluminescent display device according to claim 5, wherein the first metal layer includes a protrusion from a second surface of the first metal layer that is closer to the substrate than the first surface, the protrusion non-overlapping with the signal line.

9. The electroluminescent display device according to claim 8, wherein a thickness of the protrusion of the first metal layer is less than or equal to a thickness of the signal line.

10. The electroluminescent display device according to claim 8, wherein a width of the protrusion of the first metal layer is less than an interval between the signal line.

11. The electroluminescent display device according to claim 1, wherein the first intermediate layer planarizes a curvature in the first metal layer.

12. An electroluminescent display device comprising:
- a substrate including a display area and a non-display area that is adjacent to the display area;
- a transistor disposed in the display area on the substrate, the transistor including a semiconductor layer, a gate electrode, a source electrode, and a drain electrode;
- a connection electrode connected to the drain electrode in the display area;
- a light emitting diode disposed in the display area, the light emitting diode including a first driving electrode connected to the connection electrode, at least one light emitting layer, and a second driving electrode;
- a plurality of signal lines disposed on the substrate in the non-display area, the plurality of signal lines including a first signal line disposed on a same layer as the semiconductor layer and a second signal line disposed on a same layer as the gate electrode;
- a first intermediate layer disposed on the plurality of signal lines and the transistor;
- a plurality of metal layers disposed on the plurality of signal lines, a metal layer from the plurality of metal layers disposed on the gate electrode and including a plurality of openings in the non-display area; and
- a second intermediate layer disposed on the metal layer, the second intermediate layer connected to the first intermediate layer though the plurality of openings in the in the non-display area, and
- wherein the metal layer from the plurality of metal layers is disposed on the second signal line.

13. The electroluminescent display device according to claim 12, wherein the plurality of metal layers overlap the plurality of signal lines in the non-display area, and one of the plurality of metal layers includes a step.

14. The electroluminescent display device according to claim 12, wherein the first intermediate layer is disposed between the plurality of metal layers.

15. The electroluminescent display device according to claim 12, wherein another one of the plurality of metal layers suppresses reflection of external light.

16. The electroluminescent display device according to claim 12, wherein the metal layer comprises a mesh shape.

17. The electroluminescent display device according to claim 4, wherein the plurality of signal lines are disposed on different layers on the substrate.

18. The electroluminescent display device according to claim 12, wherein the second signal line is non-overlapping with the first signal line.

19. The electroluminescent display device according to claim 18, further comprising:
- an insulating layer disposed between the first signal line and the second signal line.

20. The electroluminescent display device according to claim 18, wherein the first signal line and the second signal line are alternately disposed on the substrate.

21. The electroluminescent display device according to claim 12, further comprising:
- a bank layer that extends from the display area to the non-display area, and
- wherein the second intermediate layer is below the bank layer in the non-display area and is closer to the bank layer than the first metal layer.

* * * * *